United States Patent
Liu et al.

(10) Patent No.: US 12,153,316 B2
(45) Date of Patent: Nov. 26, 2024

(54) DISPLAY PANEL

(71) Applicant: Wuhan China Star Optoelectronics Technology Co., Ltd., Wuhan (CN)

(72) Inventors: Liwang Liu, Wuhan (CN); Wenqiang Yu, Wuhan (CN); Chao Wang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/760,773

(22) PCT Filed: Feb. 17, 2022

(86) PCT No.: PCT/CN2022/076551
§ 371 (c)(1),
(2) Date: Mar. 16, 2022

(87) PCT Pub. No.: WO2023/151107
PCT Pub. Date: Aug. 17, 2023

(65) Prior Publication Data
US 2024/0111197 A1    Apr. 4, 2024

(30) Foreign Application Priority Data
Feb. 10, 2022   (CN) .......................... 202210123744.7

(51) Int. Cl.
   *G02F 1/1362*   (2006.01)
   *G02F 1/1368*   (2006.01)
   *H01L 27/12*    (2006.01)

(52) U.S. Cl.
   CPC ...... *G02F 1/136286* (2013.01); *G02F 1/1368* (2013.01); *H01L 27/124* (2013.01)

(58) Field of Classification Search
   CPC . G02F 1/136286; G02F 1/1368; H01L 27/124
   See application file for complete search history.

(56) References Cited

U.S. PATENT DOCUMENTS

| 2006/0139552 A1 | 6/2006 | Ahn |
| 2012/0162055 A1 | 6/2012 | Hara et al. |

(Continued)

FOREIGN PATENT DOCUMENTS

| CN | 1403860 A | 3/2003 |
| CN | 1941058 A | 4/2007 |

(Continued)

OTHER PUBLICATIONS

Chinese Office Action issued in corresponding Chinese Patent Application No. 202210123744.7 dated Apr. 26, 2023, pp. 1-8.

(Continued)

*Primary Examiner* — James A Dudek
(74) *Attorney, Agent, or Firm* — Nathan & Associates; Menachem Nathan

(57) ABSTRACT

A display panel includes a first data line, a second data line, a third data line, a first sub-pixel, a second sub-pixel, a third sub-pixel, and a first transistor. The first sub-pixel is located between the first data line and the second data line, and includes a first pixel electrode. The second sub-pixel is located between the second data line and the third data line, and includes a second pixel electrode. The third sub-pixel is located between the first data line and the second data line, and includes a third pixel electrode. The first transistor is electrically connected to one of the first pixel electrode, the second pixel electrode, and the third pixel electrode. The first transistor includes a first semiconductor. At least a part of the first semiconductor overlaps with the first pixel electrode or the second pixel electrode.

20 Claims, 7 Drawing Sheets

(56) References Cited

U.S. PATENT DOCUMENTS

2016/0216570 A1 7/2016 Yang et al.
2017/0285421 A1* 10/2017 Tsuruma ............. H01L 27/1274

FOREIGN PATENT DOCUMENTS

| | | | |
|---|---|---|---|
| CN | 101540329 | A | 9/2009 |
| CN | 101595567 | A | 12/2009 |
| CN | 102157562 | A | 8/2011 |
| CN | 202404339 | U | 8/2012 |
| CN | 103149760 | A | 6/2013 |
| CN | 103217840 | A | 7/2013 |
| CN | 108227325 | A | 6/2018 |
| CN | 112817187 | A | 5/2021 |
| CN | 113311624 | A | 8/2021 |
| CN | 214278585 | U | 9/2021 |
| KR | 20080020335 | A | 3/2008 |

OTHER PUBLICATIONS

International Search Report in International application No. PCT/CN2022/076551, mailed on Oct. 31, 2022.
Written Opinion of the International Search Authority in International application No. PCT/CN2022/076551, mailed on Oct. 31, 2022.

* cited by examiner

DISPLAY PANEL

CROSS REFERENCE TO RELATED APPLICATIONS

The present application claims priority to Chinese Patent Application No. 202210123744.7, titled "Display Panel", filed on Feb. 10, 2022 with the China National Intellectual Property Administration, which is incorporated by reference in the present application in its entirety.

FIELD OF INVENTION

The present disclosure relates to the technical field of display, and particularly to a display panel.

BACKGROUND

Virtual reality (VR) and augmented reality (AR) technologies have been used in military and aviation fields. Development of display technology will surely drive progress of VR technology and AR technology. Improvement of a resolution and a field of view of a display device is a long-term development direction of the display technology. Pixel per inch (PPI) is an important factor determining the resolution and the field of view of the display device. Liquid crystal display technology is widely used in VR equipment. An array substrate of a liquid crystal display device is provided with a large number of scan lines, data lines, and thin film transistors. The data lines are used to transmit data signals to the liquid crystal display device through the thin film transistors. The scan lines are used to regulate a timing of transmitting the data signals from the data lines. The data lines will generate an electric field when it is energized. The electric field will affect semiconductors in the thin film transistors, so that a performance stability of the thin film transistors is deteriorated, and a display effect of the liquid crystal display device is deteriorated.

Current liquid crystal display devices have a technical problem that data lines affect a performance stability of thin film transistors.

SUMMARY OF DISCLOSURE

The present disclosure provides a display panel to solve the technical problem that in current liquid crystal display devices, data lines adversely affect a performance stability of thin film transistors.

The present disclosure provides a display panel comprising a first scan line, a second scan line, a first data line, a second data line, a third data line, a pixel unit, and a first transistor. The first scan line and the second scan line extend in a first direction, are insulated from each other, and are disposed adjacent to each other. The first data line, the second data line, and the third data line extend in a second direction, are insulated from each other, and are disposed adjacent to each other. The pixel unit is located between the first scan line and the second scan line and comprises a first sub-pixel, a second sub-pixel, and a third sub-pixel. The first sub-pixel is located between the first data line and the second data line, and comprises a first pixel electrode. The second sub-pixel is located between the second data line and the third data line, and comprises a second pixel electrode. The first sub-pixel and the second sub-pixel are arranged in the first direction. The third sub-pixel is located between the first data line and the second data line, and comprises a third pixel electrode. The first sub-pixel and the third sub-pixel are arranged in the second direction. The first transistor is electrically connected to one of the first pixel electrode, the second pixel electrode, and the third pixel electrode, and comprises a first semiconductor. At least a part of the first semiconductor overlaps with the first pixel electrode or the second pixel electrode.

In an embodiment, the first transistor is electrically connected to the first pixel electrode, and at least a part of the first semiconductor overlaps with the first pixel electrode.

In an embodiment, the display panel further comprises a second transistor. The second transistor is electrically connected to the second pixel electrode or the third pixel electrode and comprises a second semiconductor. At least a part of the second semiconductor overlaps with the second pixel electrode.

In an embodiment, the display panel further comprises a third transistor. The third transistor comprises a third semiconductor. The second transistor is disposed between the first transistor and the third transistor.

In an embodiment, the second transistor is electrically connected to the second pixel electrode, and the third transistor is electrically connected to the third pixel electrode.

In an embodiment, a first end of the first semiconductor is electrically connected to the first pixel electrode through a first connection hole, a first end of the second semiconductor is electrically connected to the second pixel electrode through a second connection hole, and a first end of the third semiconductor is electrically connected to the third pixel electrode through a third connection hole.

In an embodiment, the first connection hole and the second connection hole are located on a first side of the first scan line, and the third connection hole is located on a second side of the first scan line opposite to the first side of the first scan line.

In an embodiment, a second end of the first semiconductor is electrically connected to the first data line through a fourth connection hole, a second end of the second semiconductor is electrically connected to the second data line through a fifth connection hole, and a second end of the third semiconductor is electrically connected to the third data line through a sixth connection hole.

In an embodiment, the fourth connection hole and the fifth connection hole are located on the second side of the first scan line, and the sixth connection hole is located on the first side of the first scan line.

In an embodiment, the second semiconductor is electrically connected to the third pixel electrode, and the third semiconductor is electrically connected to the second pixel electrode.

In an embodiment, a first end of the first semiconductor is electrically connected to the first pixel electrode through a first connection hole, a first end of the second semiconductor is electrically connected to the third pixel electrode through a third connection hole, and a first end of the third semiconductor is electrically connected to the second pixel electrode through a second connection hole.

In an embodiment, the first connection hole and the second connection hole are located on a first side of the first scan line, and the third connection hole is located on a second side of the first scan line opposite to the first side of the first scan line.

In an embodiment, a second end of the first semiconductor is electrically connected to the first data line through a fourth connection hole, a second end of the second semiconductor is electrically connected to the second data line through a sixth connection hole, and a second end of the third semiconductor is electrically connected to the third data line through a fifth connection hole.

In an embodiment, the fourth connection hole and the fifth connection hole are located on the second side of the first scan line, and the sixth connection hole is located on the first side of the first scan line.

In an embodiment, the display panel further comprises a fourth data line. The fourth data line is disposed on a side of the third data line away from the second data line and extends in the second direction. At least a part of the third semiconductor is located between the third data line and the fourth data line.

In an embodiment, the third connection hole is located between the second data line and the third data line. The third connection hole and the third sub-pixel are arranged in the first direction. The third connection hole and the second sub-pixel are arranged in the second direction.

In an embodiment, the display panel further comprises a first light shielding layer. The first light shielding layer covers at least the third connection hole.

In an embodiment, the display panel further comprises a second light shielding layer. The second light shielding layer is located between the first sub-pixel and the third sub-pixel and extends in the first direction.

In an embodiment, the first semiconductor is made of indium gallium zinc oxide.

The present disclosure provides a display panel comprising a first scan line, a second scan line, a first data line, a second data line, a third data line, a pixel unit, and a second transistor. The first scan line and the second scan line extend in a first direction, are insulated from each other, and are disposed adjacent to each other. The first data line, the second data line, and the third data line extend in a second direction, are insulated from each other, and are disposed adjacent to each other. The pixel unit is located between the first scan line and the second scan line and comprises a first sub-pixel, a second sub-pixel, and a third sub-pixel. The first sub-pixel is located between the first data line and the second data line, and comprises a first pixel electrode. The second sub-pixel is located between the second data line and the third data line, and comprises a second pixel electrode. The first sub-pixel and the second sub-pixel are arranged in the first direction. The third sub-pixel is located between the first data line and the second data line, and comprises a third pixel electrode. The first sub-pixel and the third sub-pixel are arranged in the second direction. The second transistor comprises a second semiconductor made of indium gallium zinc oxide. At least a part of the second semiconductor overlaps with the second pixel electrode. A first end of the second semiconductor is electrically connected to the third pixel electrode through a third connection hole. The third connection hole is located between the second data line and the third data line. The third connection hole and the third sub-pixel are arranged in the first direction. The third connection hole and the second sub-pixel are arranged in the second direction.

The present disclosure provides a display panel comprising a first data line, a second data line, a third data line, a first sub-pixel, a second sub-pixel, a third sub-pixel, and a first transistor. The first sub-pixel is located between the first data line and the second data line, and comprises a first pixel electrode. The second sub-pixel is located between the second data line and the third data line, and comprises a second pixel electrode. The third sub-pixel is located between the first data line and the second data line, and comprises a third pixel electrode. The first transistor is electrically connected to one of the first pixel electrode, the second pixel electrode, and the third pixel electrode. The first transistor comprises a first semiconductor. At least a part of the first semiconductor overlaps with the first pixel electrode or the second pixel electrode. In the present disclosure, the first semiconductor is arranged to at least partially overlap with the first pixel electrode or the second pixel electrode, so that the first semiconductor and the first data line are staggered from each other, which reduces an influence of the first data line on the first semiconductor, improves a working stability of the first thin film transistor, and improves a display quality of the display panel.

BRIEF DESCRIPTION OF DRAWINGS

In order to more clearly illustrate technical solutions in embodiments or the prior art, a brief description of accompanying drawings used in a description of the embodiments or the prior art will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
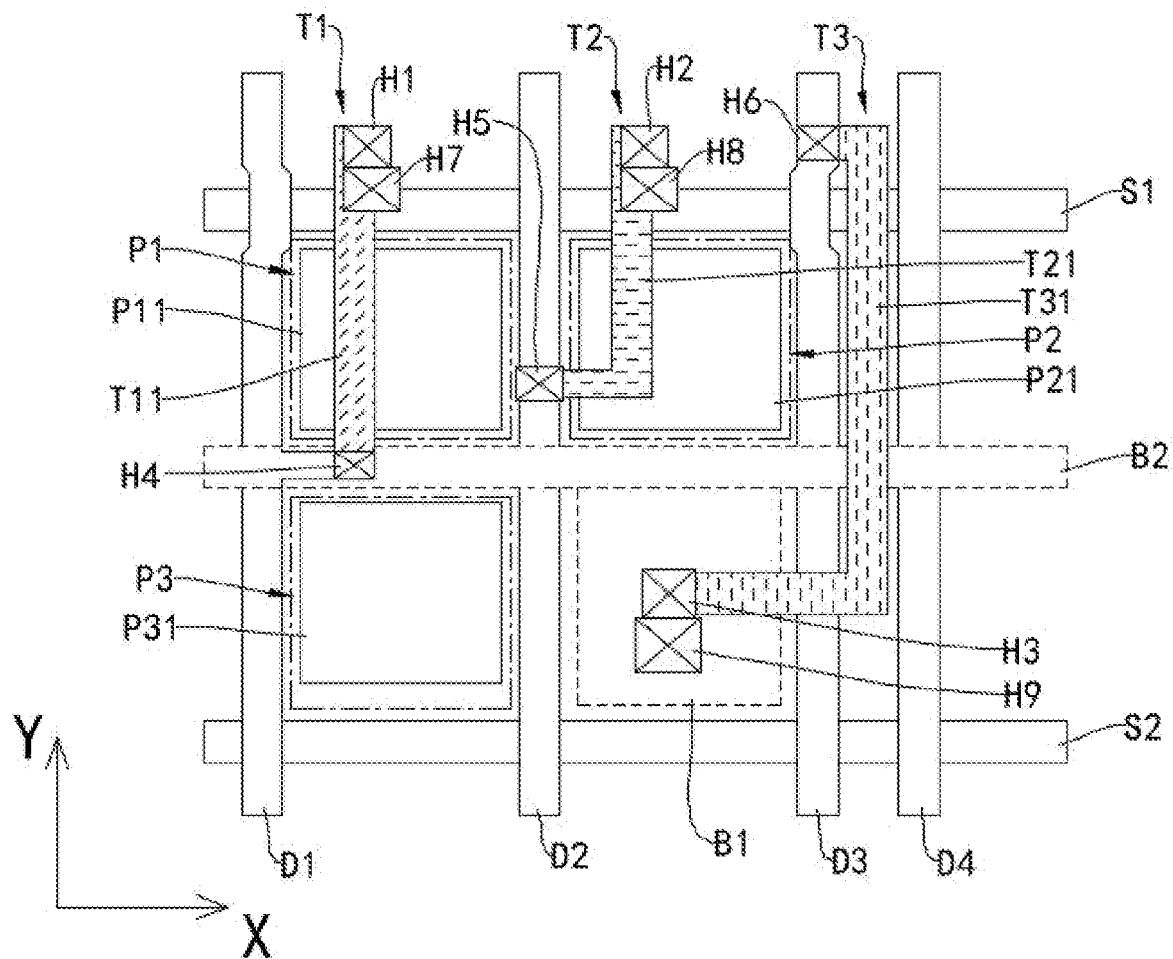
FIG. 1 is a first schematic structural diagram of a first type of a display panel according to an embodiment of the present disclosure.

The following description of various embodiments with reference to the accompanying drawings is used to illustrate specific embodiments that can be practiced in the present disclosure. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

The present disclosure provides a display panel comprising a first scan line, a second scan line, a first data line, a second data line, a third data line, a pixel unit, and a first transistor. The first scan line and the second scan line extend in a first direction, are insulated from each other, and are disposed adjacent to each other. The first data line, the second data line, and the third data line extend in a second direction, are insulated from each other, and are disposed adjacent to each other. The pixel unit is located between the first scan line and the second scan line and comprises a first sub-pixel, a second sub-pixel, and a third sub-pixel. The first sub-pixel is located between the first data line and the second data line, and comprises a first pixel electrode. The second sub-pixel is located between the second data line and the third data line, and comprises a second pixel electrode. The first sub-pixel and the second sub-pixel are arranged in the first direction. The third sub-pixel is located between the first data line and the second data line, and comprises a third pixel electrode. The first sub-pixel and the third sub-pixel are arranged in the second direction. The first transistor is electrically connected to one of the first pixel electrode, the second pixel electrode, and the third pixel electrode, and comprises a first semiconductor. At least a part of the first semiconductor overlaps with the first pixel electrode or the second pixel electrode. In the present disclosure, the first semiconductor is arranged to at least partially overlap with the first pixel electrode or the second pixel electrode, so that the first semiconductor and the first data line are staggered from each other, which reduces an influence of the first data line on the first semiconductor, improves a working stability of the first thin film transistor, and improves a display quality of the display panel.

Technical features of the display panel provided by the present disclosure will be described below in conjunction with accompany drawings.

Figure 2:
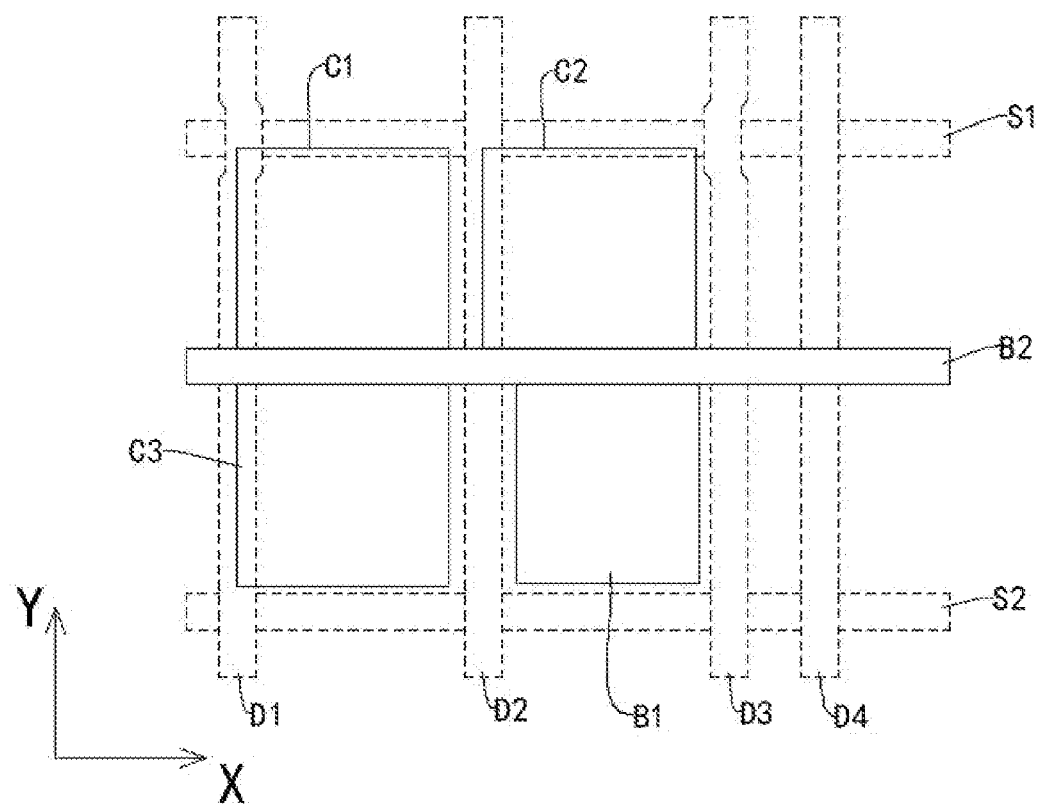
FIG. 2 is a second schematic structural diagram of the first type of the display panel according to an embodiment of the present disclosure.
Figure 3:
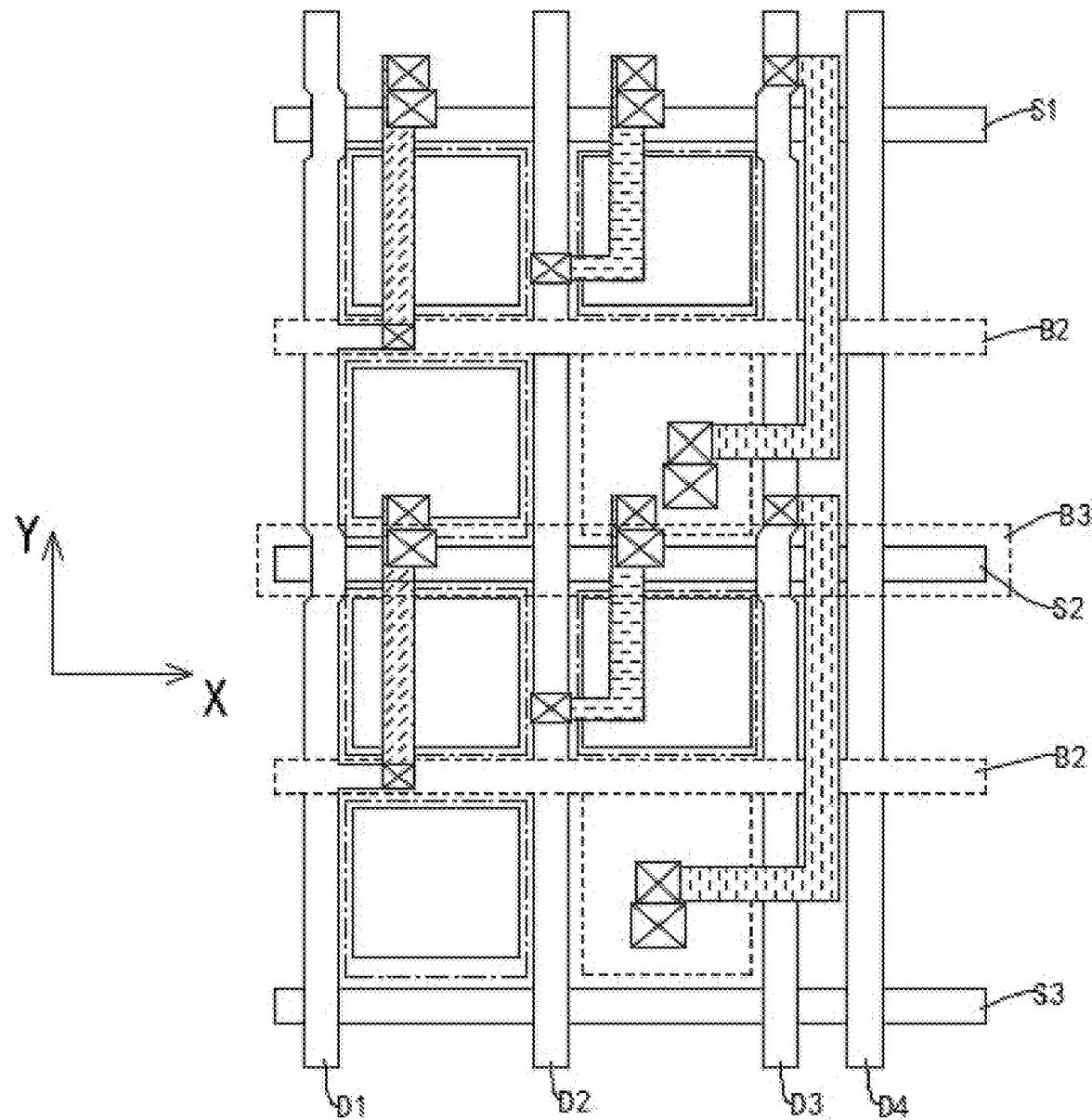
FIG. 3 is a schematic structural diagram of the first type of the display panel comprising a plurality of pixel units according to an embodiment of the present disclosure.

Please refer to FIG. 1 to FIG. 3. FIG. 1 is a first schematic structural diagram of a first type of a display panel according to an embodiment of the present disclosure. FIG. 2 is a second schematic structural diagram of the first type of the display panel according to an embodiment of the present disclosure. FIG. 3 is a schematic structural diagram of the first type of the display panel comprising a plurality of pixel units according to an embodiment of the present disclosure. It should be noted that the first schematic structural diagram of FIG. 1 shows a relative positional relationship of thin film transistors, data lines, scan lines, pixel electrodes, and other components of the display panel, and the second schematic structural diagram of FIG. 2 shows a relative positional relationship of color resist units, light shielding layers, and other components of the display panel.

The display panel provided by this embodiment comprises a plurality of the pixel units. The pixel units are arranged in an array in the display panel. It can be understood that one pixel unit is a smallest repeating unit in the display panel. The pixel units emit light cooperatively to realize a display function of the display panel. Each of the pixel units may be a partial area in the display panel. A backlight unit, data lines, scan lines, thin film transistors, pixel electrodes, liquid crystals, color resists, and the like required to realize light emission of one pixel unit are disposed in one partial area.

Specifically, please refer to FIG. 1, the display panel comprises: a first scan line S1 and a second scan line S2 extending in a first direction X, insulated from each other, and disposed adjacent to each other; a first data line D1, a second data line D2, and a third data line D3 extending in a second direction Y, insulated from each other, and disposed adjacent to each other; and a pixel unit located between the first scan line S1 and the second scan line S2. The first data line D1, the second data line D2, and the third data line D3 are arranged adjacent to each other, and are all configured to provide data signals. The first scan line S1 and the second scan line S2 are arranged adjacent to each other, and both are configured to provide scan signals.

The pixel unit comprises: a first sub-pixel P1 and a third sub-pixel P3 located between the first data line D1 and the second data line D2, and a second sub-pixel P2 located between the second data line D2 and the third data line D3. The first sub-pixel P1 and the second sub-pixel P2 are arranged in the first direction X. The first sub-pixel P1 and the third sub-pixel P3 are arranged in the second direction Y. The first sub-pixel P1 comprises a first pixel electrode P11. The second sub-pixel P2 comprises a second pixel electrode P21. The third sub-pixel P3 comprises a third pixel electrode P31. The first direction X and the second direction Y are two different directions and are not parallel. Optionally, the first direction X and the second direction Y are perpendicular to each other.

In this embodiment, the first sub-pixel P1 and the second sub-pixel P2 are arranged in the first direction X, and the first sub-pixel P1 and the third sub-pixel P3 are arranged in the second direction Y different from the first direction X, thereby reducing the number of sub-pixels arranged in the first direction X in the pixel unit. This is beneficial to reduce a width of each pixel unit in the first direction X and increase a pixel density of the display panel without changing process conditions.

Furthermore, the display panel further comprises a first transistor T1, a second transistor T2, and a third transistor T3. The first transistor T1 comprises a first semiconductor T11. The second transistor T2 comprises a second semiconductor T21. The third transistor T3 comprises a third semiconductor T31. The first transistor T1, the second transistor T2, and the third transistor T3 are arranged in the first direction X. The second transistor T2 is located between the first transistor T1 and the third transistor T3.

The first transistor T1 is electrically connected to the first pixel electrode P11. The second transistor T2 is electrically connected to the second pixel electrode P21. The third transistor T3 is electrically connected to the third pixel electrode P31. At least a part of one or more of the first semiconductor T11, the second semiconductor T21, and the third semiconductor T31 overlaps with the first pixel electrode P11 or the second pixel electrode P21. It can be understood that each pixel electrode in the display panel is located in an area between data lines. In this embodiment, at least a part of a semiconductor is disposed in an area corresponding to the pixel electrode, so that the semiconductor and the data lines are staggered, which effectively reduces an influence of the data lines on performance of the semiconductor and improves a working stability of a thin film transistor. This is beneficial to improve the display quality of the display panel.

Furthermore, in a layer structure of the display panel, a distance between a layer where the pixel electrode is located and a layer where the semiconductor is located is much greater than a distance between a layer where the data lines are located and the layer where the semiconductor is located. Therefore, in this embodiment, the semiconductor overlaps with the pixel electrode, which does not significantly increase an influence of an electric field generated by the pixel electrode on the semiconductor, but greatly weakens an influence of an electric field generated by the data lines on the semiconductor.

Specifically, at least a part of the first semiconductor T11 overlaps with the first pixel electrode P11, thereby weakening an influence of the first data line D1 on the first transistor T1. And, at least a part of the second semiconductor T21 overlaps with the second pixel electrode P21, thereby weakening an influence of the second data line D2 on the second transistor T2.

Furthermore, the display panel further comprises a fourth data line D4. The fourth data line D4 is disposed on a side of the third data line D3 away from the second data line D2 and extends in the second direction Y. At least a part of the third semiconductor T31 is located between the third data line D3 and the fourth data line D4. This is beneficial to weaken an influence of the third data line D3 on the third transistor T3 and improve the display quality of the display panel.

Optionally, at least one of the first semiconductor T11, the second semiconductor T21, and the third semiconductor T31 is made of indium gallium zinc oxide (IGZO). It can be understood that indium gallium zinc oxide is a transparent semiconductor material, so when it is disposed at a position overlapping with the pixel electrode, it will not have a significant impact on a light output of the display panel. Furthermore, when the first semiconductor T11, the second semiconductor T21, and the third semiconductor T31 are made of indium gallium zinc oxide (IGZO), the first transistor T1, the second transistor T2, and the third transistor T3 have smaller leakage currents, thereby further improving the display quality of the display panel. The first semiconductor T11, the second semiconductor T21, and the third semiconductor T31 may be made of other transparent semiconductor materials, which will not be described in detail herein.

Moreover, a first end of the first semiconductor T11 is electrically connected to the first pixel electrode P11 through a first connection hole H1. A first end of the second semiconductor T21 is electrically connected to the second pixel electrode P21 through a second connection hole H2. A first end of the third semiconductor T31 is electrically connected to the third pixel electrode P31 through a third connection hole H3. Both the first connection hole H1 and the second connection hole H2 are located on a first side of the first scan line S1. The third connection hole H3 is located on a second side of the first scan line S1 opposite to the first side of the first scan line S1.

A second end of the first semiconductor T11 is electrically connected to the first data line D1 through a fourth connection hole H4. A second end of the second semiconductor T21 is electrically connected to the second data line D2 through a fifth connection hole H5. A second end of the third semiconductor T31 is electrically connected to the third data line D3 through a sixth connection hole H6. Both the fourth connection hole H4 and the fifth connection hole H5 are located on the second side of the first scan line S1. The sixth connection hole H6 is located on the first side of the first scan line S1.

Specifically, the third connection hole H3 is located between the second data line D2 and the third data line D3. The third connection hole H3 and the third sub-pixel P3 are arranged in the first direction X. The third connection hole H3 and the second sub-pixel P2 are arranged in the second direction Y. In this embodiment, the third connection hole H3 is arranged in a blank area formed after the first sub-pixel P1, the second sub-pixel P2, and the third sub-pixel P3 are arranged in two rows as described above. This fully utilizes a space of one pixel unit in the display panel, which is beneficial to improve a degree of freedom of a position of the third connection hole H3 and improve a process yield.

Furthermore, the display panel further comprises a seventh connection hole H7. The first end of the first semiconductor T11 is first drawn out through the first connection hole H1, and further connected to the first pixel electrode P11 through the seventh connection hole H7. The first connection hole H1 and the seventh connection hole H7 may partially overlap or not overlap.

The display panel further comprises an eighth connection hole H8. The first end of the second semiconductor T21 is first drawn out through the second connection hole H2, and further connected to the second pixel electrode P21 through the eighth connection hole H8. The second connection hole H2 and the eighth connection hole H8 may partially overlap or not overlap.

The display panel further comprises a ninth connection hole H9. The first end of the third semiconductor T31 is first drawn out through the third connection hole H3, and further connected to the third pixel electrode P31 through the ninth connection hole H9. The third connection hole H3 and the ninth connection hole H9 may partially overlap or not overlap.

Furthermore, the ninth connection hole H9 is located between the second data line D2 and the third data line D3. The ninth connection hole H9 and the third sub-pixel P3 are arranged in the first direction X. The ninth connection hole H9 and the second sub-pixel P2 are arranged in the second direction Y. In this embodiment, the third connection hole H3 and the ninth connection hole H9 are arranged in the blank area formed after the first sub-pixel P1, the second sub-pixel P2, and the third sub-pixel P3 are arranged in the two rows as described above. This fully utilizes the space of one pixel unit in the display panel, which is beneficial to improve a degree of freedom of positions of the third connection hole H3 and the ninth connection hole H9 and improve the process yield.

The display panel further comprises a first light shielding layer B1. The first light shielding layer B1 is located between the second data line D2 and the third data line D3. The first light shielding layer B1 and the third sub-pixel P3 are arranged in the first direction X. The first light shielding layer B1 and the second sub-pixel P2 are arranged in the second direction Y. The first light shielding layer B1 covers at least the third connection hole H3. The first light shielding layer B1 may further cover the ninth connection hole H9. In this embodiment, the first light shielding layer B1 is configured to prevent a light reflected by metal wires in an area where the third connection hole H3 is located from affecting a display effect of the display panel.

Furthermore, please refer to FIG. 1 and FIG. 2, the first sub-pixel P1 further comprises a first color resist unit C1, the second sub-pixel P2 further comprises a second color resist unit C2, and the third sub-pixel P3 further comprises a third color resist unit C3. The first color resist unit C1, the second color resist unit C2, and the third color resist unit C3 may be a red resist, a green resist, and a blue resist, respectively. The first color resist unit C1, the second color resist unit C2, and the third color resist unit C3 are configured to realize colored light emission of the display panel.

The display panel further comprises a second light shielding layer B2 disposed between the first sub-pixel P1 and the third sub-pixel P3. One side of the second light shielding layer B2 is in contact with the first color resist unit C1, and the other side of the second light shielding layer B2 is in contact with the third color resist unit C3. The second light shielding layer B2 is configured to shield a part of a light emitted by the first sub-pixel P1 and a part of a light emitted by the third sub-pixel P3, thereby preventing color mixing of the first sub-pixel P1 and the third sub-pixel P3.

Furthermore, please refer to FIG. 1 to FIG. 3, the display panel further comprises a third scan line S3 extending in the first direction X and adjacent to the second scan line S2. The pixel unit located between the first scan line S1 and the second scan line S2 described above is referred to as a first pixel unit, and one pixel unit located between the second scan line S2 and the third scan line S3 is referred to as a second pixel unit. The display panel further comprises a third light shielding layer B3 disposed between the first pixel unit and the second pixel unit. The third light shielding layer B3 is configured to shield a part of a light emitted by the first pixel unit and a part of a light emitted by the second pixel unit, so as to prevent color mixing of the first pixel unit and the second pixel unit.

Optionally, each of the second light shielding layer B2 and the third light shielding layer B3 has a stripe structure extending in the first direction X. The display panel may comprise a plurality of the second light shielding layers B2 and a plurality of the third light shielding layers B3.

Figure 4:
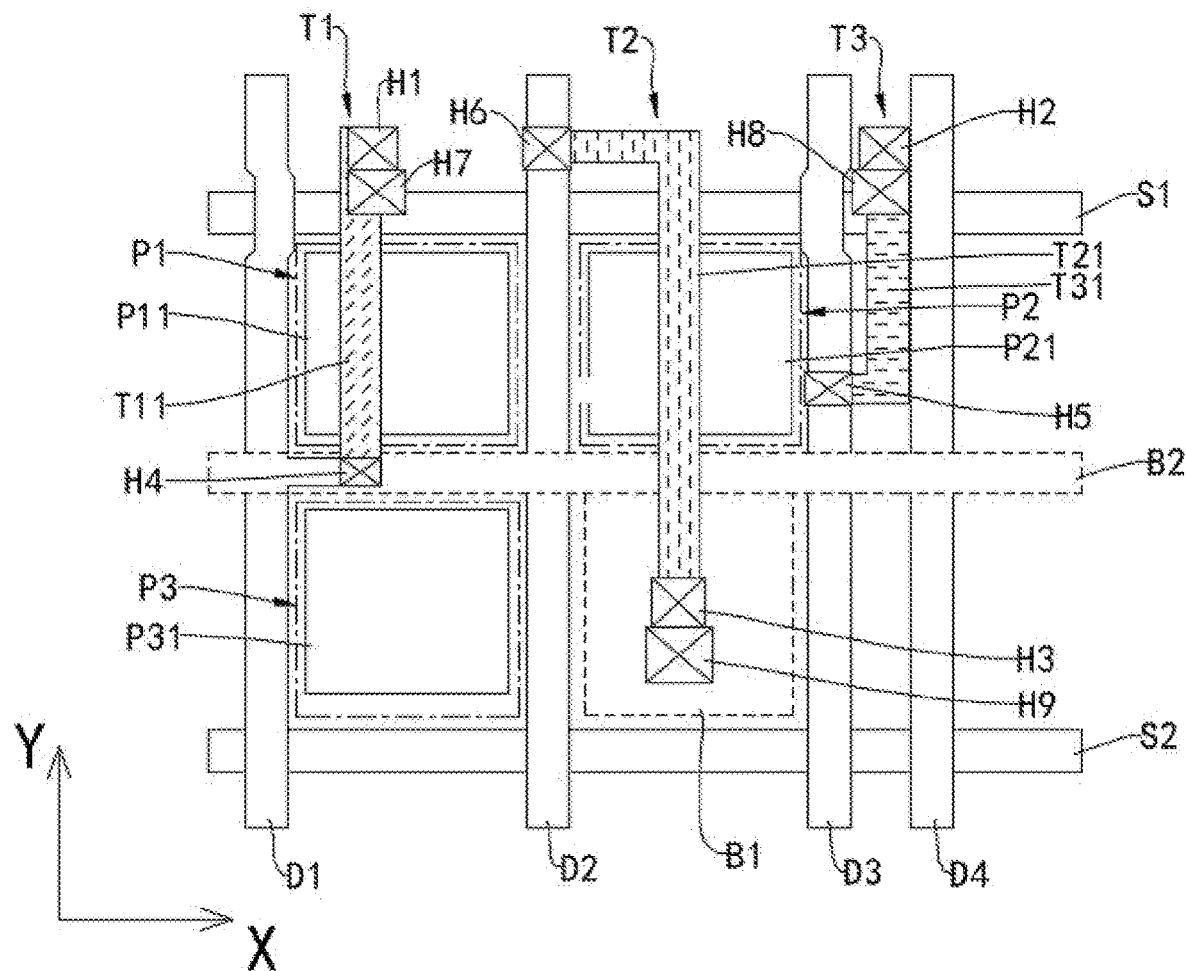
FIG. 4 is a first schematic structural diagram of a second type of a display panel according to an embodiment of the present disclosure.
Figure 5:
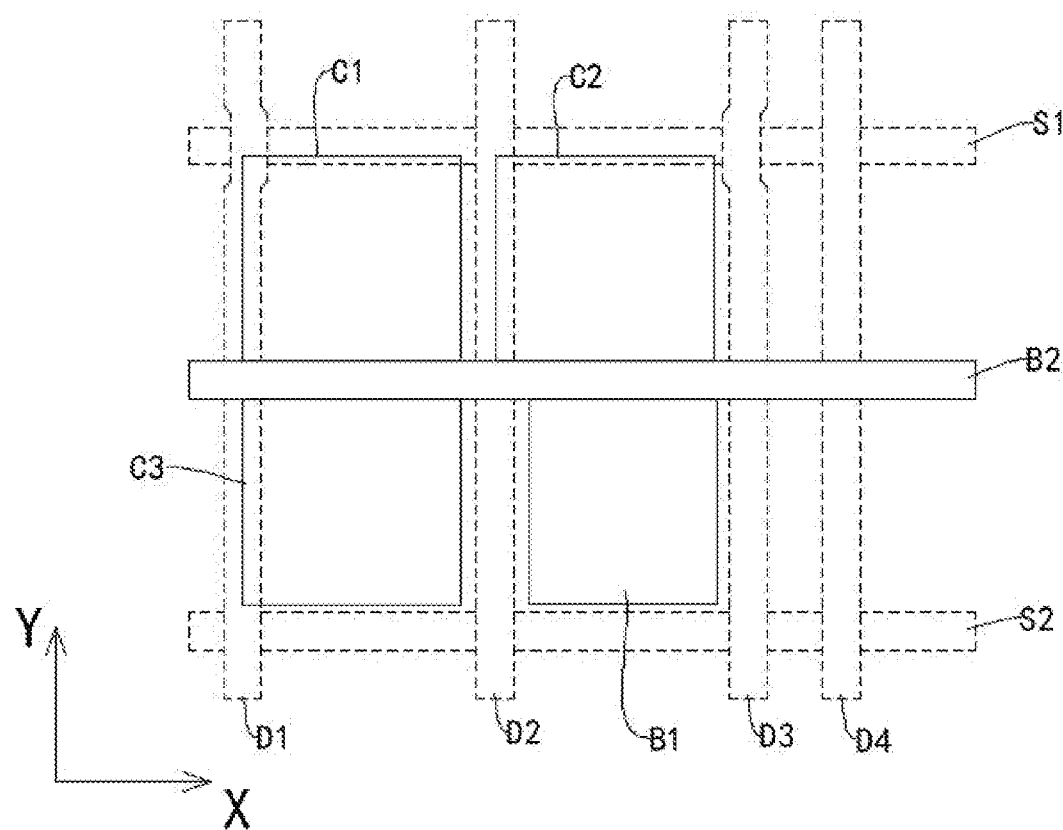
FIG. 5 is a second schematic structural diagram of the second type of the display panel according to an embodiment of the present disclosure.
Figure 6:
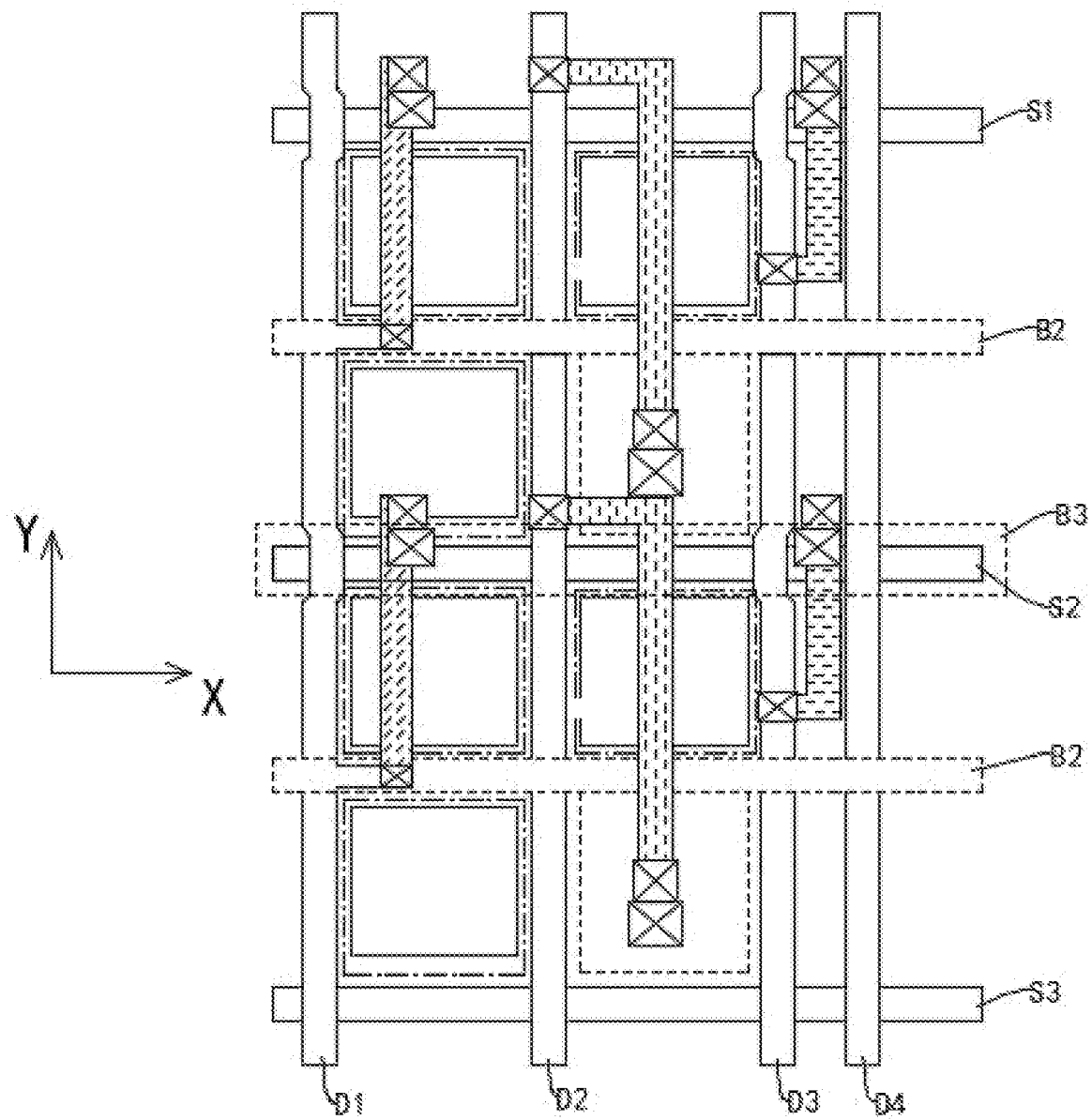
FIG. 6 is a schematic structural diagram of the second type of the display panel comprising a plurality of pixel units according to an embodiment of the present disclosure.

Please refer to FIG. 4 to FIG. 6. FIG. 4 is a first schematic structural diagram of a second type of a display panel according to an embodiment of the present disclosure. FIG. 5 is a second schematic structural diagram of the second type of the display panel according to an embodiment of the present disclosure. FIG. 6 is a schematic structural diagram of the second type of the display panel comprising a plurality of pixel units according to an embodiment of the present disclosure. It should be noted that the display panel described in this embodiment has a same or similar structure as the display panel described in the above embodiment. Features described in the above embodiments are also applicable to this embodiment.

This embodiment provides a display panel comprising a plurality of pixel units. The pixel units are arranged in an array in the display panel. Please refer to FIG. 4, the display panel comprises: a first scan line S1 and a second scan line S2 extending in a first direction X, insulated from each other, and disposed adjacent to each other; a first data line D1, a second data line D2, and a third data line D3 extending in a second direction Y, insulated from each other, and disposed adjacent to each other; and one pixel unit located between the first scan line S1 and the second scan line S2. The first data line D1, the second data line D2, and the third data line D3 are all configured to provide data signals. Both the first scan line S1 and the second scan line S2 are configured to provide scan signals.

The pixel unit comprises: a first sub-pixel P1 and a third sub-pixel P3 located between the first data line D1 and the second data line D2, and a second sub-pixel P2 located between the second data line D2 and the third data line D3. The first sub-pixel P1 and the second sub-pixel P2 are arranged in the first direction X. The first sub-pixel P1 and the third sub-pixel P3 are arranged in the second direction Y. The first sub-pixel P1 comprises a first pixel electrode P11. The second sub-pixel P2 comprises a second pixel electrode P21. The third sub-pixel P3 comprises a third pixel electrode P31. The first direction X and the second direction Y are two different directions and are not parallel. Optionally, the first direction X and the second direction Y are perpendicular to each other.

The display panel further comprises a first transistor T1, a second transistor T2, and a third transistor T3. The first transistor T1 comprises a first semiconductor T11. The second transistor T2 comprises a second semiconductor T21. The third transistor T3 comprises a third semiconductor T31. The first transistor T1, the second transistor T2, and the third transistor T3 are arranged in the first direction X. The second transistor T2 is located between the first transistor T1 and the third transistor T3.

The first transistor T1 is electrically connected to the first pixel electrode P11, the second transistor T2 is electrically connected to the third pixel electrode P31, and the third transistor T3 is electrically connected to the second pixel electrode P21. At least a part of one or more of the first semiconductor T11, the second semiconductor T21, and the third semiconductor T31 overlaps with the first pixel electrode P11 or the second pixel electrode P21. It can be understood that each pixel electrode in the display panel is located in an area between data lines. In this embodiment, at least a part of a semiconductor is disposed in an area corresponding to the pixel electrode, so that the semiconductor and the data lines are staggered, which effectively reduces an influence of the data lines on performance of the semiconductor and improves a working stability of a thin film transistor. This is beneficial to improve the display quality of the display panel.

Furthermore, at least a part of the first semiconductor T11 overlaps with the first pixel electrode P11, thereby weakening an influence of the first data line D1 on the first transistor T1. And, at least a part of the second semiconductor T21 overlaps with the second pixel electrode P21, thereby weakening an influence of the second data line D2 on the second transistor T2.

Furthermore, the display panel further comprises a fourth data line D4. The fourth data line D4 is disposed on a side of the third data line D3 away from the second data line D2 and extends in the second direction Y. At least a part of the third semiconductor T31 is located between the third data line D3 and the fourth data line D4. This is beneficial to weaken an influence of the third data line D3 on the third transistor T3 and improve the display quality of the display panel.

Optionally, at least one of the first semiconductor T11, the second semiconductor T21, and the third semiconductor T31 is made of indium gallium zinc oxide (IGZO). It can be understood that indium gallium zinc oxide is a transparent semiconductor material, so when it is disposed at a position overlapping with the pixel electrode, it will not have a significant impact on a light output of the display panel. Furthermore, when the first semiconductor T11, the second semiconductor T21, and the third semiconductor T31 are made of indium gallium zinc oxide (IGZO), the first transistor T1, the second transistor T2, and the third transistor T3 have smaller leakage currents, thereby further improving the display quality of the display panel. The first semiconductor T11, the second semiconductor T21, and the third semiconductor T31 may be made of other transparent semiconductor materials, which will not be described in detail herein.

Furthermore, a first end of the first semiconductor T11 is electrically connected to the first pixel electrode P11 through a first connection hole H1. A first end of the second semiconductor T21 is electrically connected to the third pixel electrode P31 through a third connection hole H3. A first end of the third semiconductor T31 is electrically connected to the second pixel electrode P21 through a second connection hole H2. Both the first connection hole H1 and the second connection hole H2 are located on a first side of the first scan line S1. The third connection hole H3 is located on a second side of the first scan line S1 opposite to the first side of the first scan line S1.

A second end of the first semiconductor T11 is electrically connected to the first data line D1 through a fourth connection hole H4. A second end of the second semiconductor T21 is electrically connected to the second data line D2 through a sixth connection hole H6. A second end of the third semiconductor T31 is electrically connected to the third data line D3 through a fifth connection hole H5. Both the fourth connection hole H4 and the fifth connection hole H5 are located on the second side of the first scan line S1. The sixth connection hole H6 is located on the first side of the first scan line S1.

Specifically, the third connection hole H3 is located between the second data line D2 and the third data line D3.

The third connection hole H3 and the third sub-pixel P3 are arranged in the first direction X. The third connection hole H3 and the second sub-pixel P2 are arranged in the second direction Y. In this embodiment, the third connection hole H3 is arranged in a blank area formed after the first sub-pixel P1, the second sub-pixel P2, and the third sub-pixel P3 are arranged in two rows as described above. This fully utilizes a space of one pixel unit in the display panel, which is beneficial to improve a degree of freedom of a position of the third connection hole H3 and improve a process yield.

Furthermore, the display panel further comprises a seventh connection hole H7. The first end of the first semiconductor T11 is first drawn out through the first connection hole H1, and further connected to the first pixel electrode P11 through the seventh connection hole H7. The first connection hole H1 and the seventh connection hole H7 may partially overlap or not overlap.

The display panel further comprises a ninth connection hole H9. The first end of the second semiconductor T21 is first drawn out through the third connection hole H3, and further connected to the third pixel electrode P31 through the ninth connection hole H9. The third connection hole H3 and the ninth connection hole H9 may partially overlap or not overlap.

Furthermore, the ninth connection hole H9 is located between the second data line D2 and the third data line D3. The ninth connection hole H9 and the third sub-pixel P3 are arranged in the first direction X. The ninth connection hole H9 and the second sub-pixel P2 are arranged in the second direction Y. In this embodiment, the third connection hole H3 and the ninth connection hole H9 are arranged in the blank area formed after the first sub-pixel P1, the second sub-pixel P2, and the third sub-pixel P3 are arranged in the two rows as described above. This fully utilizes the space of one pixel unit in the display panel, which is beneficial to improve a degree of freedom of positions of the third connection hole H3 and the ninth connection hole H9 and improve the process yield.

The display panel further comprises an eighth connection hole H8. The first end of the third semiconductor T31 is first drawn out through the second connection hole H2, and further connected to the second pixel electrode P21 through the eighth connection hole H8. The second connection hole H2 and the eighth connection hole H8 may partially overlap or not overlap.

The display panel further comprises a first light shielding layer B1. The first light shielding layer B1 is located between the second data line D2 and the third data line D3. The first light shielding layer B1 and the third sub-pixel P3 are arranged in the first direction X. The first light shielding layer B1 and the second sub-pixel P2 are arranged in the second direction Y. The first light shielding layer B1 covers at least the third connection hole H3. The first light shielding layer B1 may further cover the ninth connection hole H9. In this embodiment, the first light shielding layer B1 is configured to prevent a light reflected by metal wires in an area where the third connection hole H3 is located from affecting a display effect of the display panel.

Furthermore, please refer to FIG. 4 and FIG. 5, the first sub-pixel P1 further comprises a first color resist unit C1, the second sub-pixel P2 further comprises a second color resist unit C2, and the third sub-pixel P3 further comprises a third color resist unit C3. The first color resist unit C1, the second color resist unit C2, and the third color resist unit C3 may be a red resist, a green resist, and a blue resist, respectively. The first color resist unit C1, the second color resist unit C2, and the third color resist unit C3 are configured to realize colored light emission of the display panel.

The display panel further comprises a second light shielding layer B2 disposed between the first sub-pixel P1 and the third sub-pixel P3. One side of the second light shielding layer B2 is in contact with the first color resist unit C1, and the other side of the second light shielding layer B2 is in contact with the third color resist unit C3. The second light shielding layer B2 is configured to shield a part of a light emitted by the first sub-pixel P1 and a part of a light emitted by the third sub-pixel P3, thereby preventing color mixing of the first sub-pixel P1 and the third sub-pixel P3.

Furthermore, please refer to FIG. 4 to FIG. 6, the display panel further comprises a third scan line S3 extending in the first direction X and adjacent to the second scan line S2. The pixel unit located between the first scan line S1 and the second scan line S2 described above is referred to as a first pixel unit, and one pixel unit located between the second scan line S2 and the third scan line S3 is referred to as a second pixel unit. The display panel further comprises a third light shielding layer B3 disposed between the first pixel unit and the second pixel unit. The third light shielding layer B3 is configured to shield a part of a light emitted by the first pixel unit and a part of a light emitted by the second pixel unit, so as to prevent color mixing of the first pixel unit and the second pixel unit.

Optionally, each of the second light shielding layer B2 and the third light shielding layer B3 has a stripe structure extending in the first direction X. The display panel may comprise a plurality of the second light shielding layers B2 and a plurality of the third light shielding layers B3.

Figure 7:
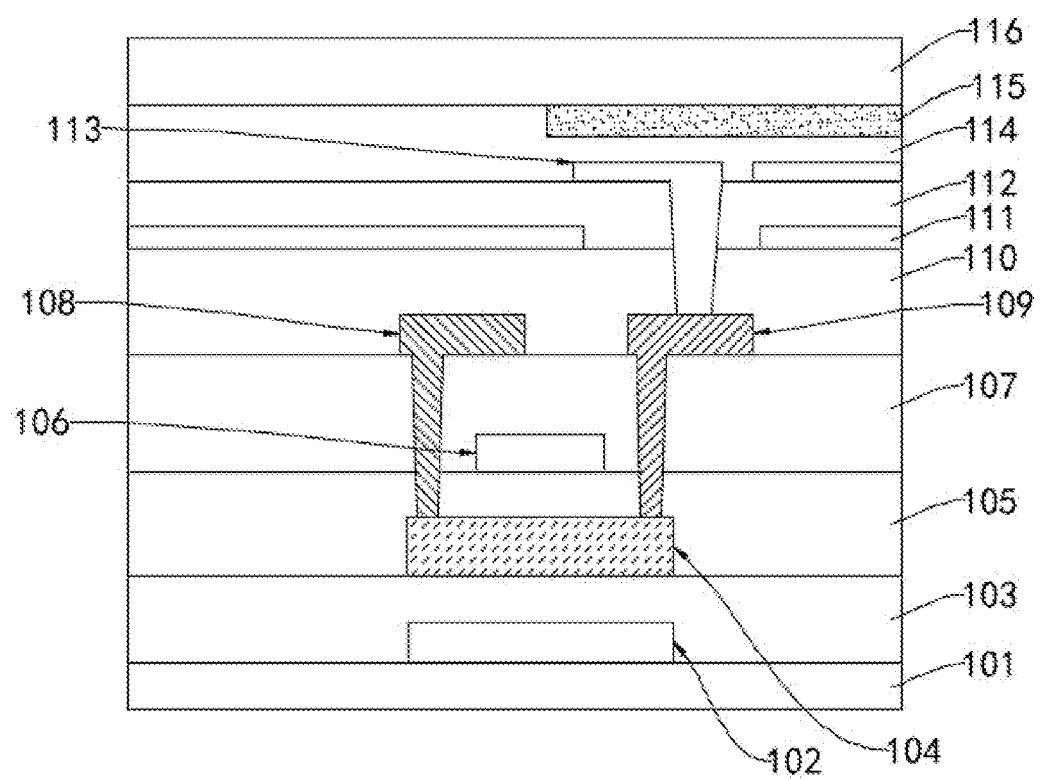
FIG. 7 is a schematic cross-sectional structural diagram of a display panel according to an embodiment of the present disclosure.

Please refer to FIG. 7, which is a schematic cross-sectional structural diagram of a display panel according to an embodiment of the present disclosure. The display panel comprises a first base substrate 101, a shielding layer 102 disposed on the first base substrate 101, a buffer layer 103 covering the shielding layer 102, a semiconductor layer 104 disposed on the buffer layer 103, a gate insulating layer 105 covering the semiconductor layer 104, a gate electrode 106 disposed on the gate insulating layer 105, a interlayer insulating layer 107 covering the gate electrode 106, a source electrode 108 and a drain electrode 109 disposed on the interlayer insulating layer 107, a planarization layer 110 covering the source electrode 108 and the drain electrode 109, a common electrode 111 disposed on the planarization layer 110, a passivation layer 112 covering the common electrode 111, a pixel electrode 113 disposed on the passivation layer 112, a liquid crystal layer 114 disposed on the passivation layer 112, a color resist layer 115 disposed on the liquid crystal layer 114, and a second base substrate 116 disposed on the color resist layer 115.

The shielding layer 102 is configured to prevent a light from emitting from the first base substrate 101 to the semiconductor layer 104. The second end of the first semiconductor T11, the second end of the second semiconductor T21, and the second end of the third semiconductor T31 shown in FIG. 1 or FIG. 4 may all be equivalent to one end of the semiconductor layer 104 connected to the source electrode 108. The first end of the first semiconductor T11, the first end of the second semiconductor T21, and the first end of the third transistor T3 semiconductor T31 shown in FIG. 1 or FIG. 4 may all be equivalent to one end of the semiconductor layer 104 connected to the drain electrode 109. The pixel electrode 113 may be equivalent to the first pixel electrode P11, the second pixel electrode P21, or the third pixel electrode P31 shown in FIG. 1 or FIG. 4. The color resist layer 115 may be equivalent to the first color resist unit C1, the second color resist unit C2, or the third color resist unit C3 shown in FIG. 2 or FIG. 5.

The semiconductor layer 104, the gate electrode 106, the source electrode 108, and the drain electrode 109 constitute a thin film transistor. The thin film transistor is equivalent to the first transistor T1, the second transistor T2, or the third transistor T3 shown in FIG. 1 or FIG. 4.

The liquid crystal layer 114 comprises liquid crystals. The liquid crystals are deflected at various angles under a cross electric field provided by the common electrode 111 and the pixel electrode 113, so that the display panel can display different gray scales.

The display panel further comprises a black matrix disposed in a same layer as the color resist layer 115 or a layer adjacent to the color resist layer 115. The black matrix comprises the first light shielding layer B1, the second light shielding layer B2, and the third light shielding layer B3 shown in any one of FIG. 1 to FIG. 6.

Further, the display panel further comprises a backlight module. The backlight module is disposed on a side of the first base substrate 101 away from the shielding layer 102. The backlight module is configured to provide a backlight source for the display panel.

The present disclosure further provides a display device. The display device comprises the display panel provided by the present disclosure. The display device may be a notebook computer, a tablet computer, a mobile phone, a computer monitor, a television, a navigator, and other apparatus with a function of displaying images.

In the above, in the display panel provided by the present disclosure, at least one of the first semiconductor, the second semiconductor, and the third semiconductor at least partially overlaps with the first pixel electrode or the second pixel electrode, so that the semiconductors and the data lines are staggered from each other, thereby reducing the influence of the data lines on performance of the semiconductors, improving the working stability of the thin film transistors, and improving the display quality of the display panel. Furthermore, in the present disclosure, the first sub-pixel and the second sub-pixel are arranged in the first direction, and the first sub-pixel and the third sub-pixel are arranged in the second direction different from the first direction, thereby reducing the number of sub-pixels arranged in the first direction in the pixel unit. This is beneficial to reduce a width of each pixel unit in the first direction and increase a pixel density of the display panel without changing process conditions.

It should be noted that although the present invention is described in the above specific embodiments, the above specific embodiments are not intended to limit the present invention. Those skilled in the art may make various changes and modifications without departing from the scope of the present invention. The scope of the present invention is determined by claims.

What is claimed is:

1. A display panel, comprising:
   a first scan line and a second scan line extending in a first direction, insulated from each other, and disposed adjacent to each other;
   a first data line, a second data line, and a third data line extending in a second direction, insulated from each other, and disposed adjacent to each other;
      a pixel unit located between the first scan line and the second scan line and comprising: a first sub-pixel located between the first data line and the second data line, and comprising a first pixel electrode;
      a second sub-pixel located between the second data line and the third data line, and comprising a second pixel electrode, wherein the first sub-pixel and the second sub-pixel are arranged in the first direction; and
      a third sub-pixel located between the first data line and the second data line, and comprising a third pixel electrode, wherein the first sub-pixel and the third sub-pixel are arranged in the second direction; and
   a first transistor electrically connected to one of the first pixel electrode, the second pixel electrode, and the third pixel electrode, and comprising a first semiconductor, wherein at least a part of the first semiconductor overlaps with the first pixel electrode or the second pixel electrode; the first semiconductor is staggered from the first data line and the second data line.

2. The display panel according to claim 1, wherein the first transistor is electrically connected to the first pixel electrode, and at least a part of the first semiconductor overlaps with the first pixel electrode.

3. The display panel according to claim 2, further comprising:
   a second transistor electrically connected to the second pixel electrode or the third pixel electrode and comprising a second semiconductor, wherein at least a part of the second semiconductor overlaps with the second pixel electrode.

4. The display panel according to claim 3, further comprising:
   a third transistor comprising a third semiconductor, wherein the second transistor is disposed between the first transistor and the third transistor.

5. The display panel according to claim 4, wherein the second transistor is electrically connected to the second pixel electrode, and the third transistor is electrically connected to the third pixel electrode.

6. The display panel according to claim 5, wherein a first end of the first semiconductor is electrically connected to the first pixel electrode through a first connection hole, a first end of the second semiconductor is electrically connected to the second pixel electrode through a second connection hole, and a first end of the third semiconductor is electrically connected to the third pixel electrode through a third connection hole.

7. The display panel according to claim 6, wherein the first connection hole and the second connection hole are located on a first side of the first scan line, and the third connection hole is located on a second side of the first scan line opposite to the first side of the first scan line.

8. The display panel according to claim 7, wherein a second end of the first semiconductor is electrically connected to the first data line through a fourth connection hole, a second end of the second semiconductor is electrically connected to the second data line through a fifth connection hole, and a second end of the third semiconductor is electrically connected to the third data line through a sixth connection hole.

9. The display panel according to claim 8, wherein the fourth connection hole and the fifth connection hole are located on the second side of the first scan line, and the sixth connection hole is located on the first side of the first scan line.

10. The display panel according to claim 4, wherein the second semiconductor is electrically connected to the third pixel electrode, and the third semiconductor is electrically connected to the second pixel electrode.

11. The display panel according to claim 10, wherein a first end of the first semiconductor is electrically connected to the first pixel electrode through a first connection hole, a first end of the second semiconductor is electrically connected to the third pixel electrode through a third connection hole, and a first end of the third semiconductor is electrically connected to the second pixel electrode through a second connection hole.

12. The display panel according to claim 11, wherein the first connection hole and the second connection hole are located on a first side of the first scan line, and the third connection hole is located on a second side of the first scan line opposite to the first side of the first scan line.

13. The display panel according to claim 12, wherein a second end of the first semiconductor is electrically connected to the first data line through a fourth connection hole, a second end of the second semiconductor is electrically connected to the second data line through a sixth connection hole, and a second end of the third semiconductor is electrically connected to the third data line through a fifth connection hole.

14. The display panel according to claim 13, wherein the fourth connection hole and the fifth connection hole are located on the second side of the first scan line, and the sixth connection hole is located on the first side of the first scan line.

15. The display panel according to claim 4, further comprising:
a fourth data line disposed on a side of the third data line away from the second data line and extending in the second direction, wherein at least a part of the third semiconductor is located between the third data line and the fourth data line.

16. The display panel according to claim 6, wherein the third connection hole is located between the second data line and the third data line, the third connection hole and the third sub-pixel are arranged in the first direction, and the third connection hole and the second sub-pixel are arranged in the second direction.

17. The display panel according to claim 16, further comprising:
a first light shielding layer covering at least the third connection hole.

18. The display panel according to claim 17, further comprising:
a second light shielding layer located between the first sub-pixel and the third sub-pixel and extending in the first direction.

19. The display panel according to claim 1, wherein the first semiconductor is made of indium gallium zinc oxide.

20. A display panel, comprising:
a first scan line and a second scan line extending in a first direction, insulated from each other, and disposed adjacent to each other;
a first data line, a second data line, and a third data line extending in a second direction, insulated from each other, and disposed adjacent to each other;
a pixel unit located between the first scan line and the second scan line and comprising: a first sub-pixel located between the first data line and the second data line, and comprising a first pixel electrode;
a second sub-pixel located between the second data line and the third data line, and comprising a second pixel electrode, wherein the first sub-pixel and the second sub-pixel are arranged in the first direction; and
a third sub-pixel located between the first data line and the second data line, and comprising a third pixel electrode, wherein the first sub-pixel and the third sub-pixel are arranged in the second direction; and
a second transistor comprising a second semiconductor made of indium gallium zinc oxide, wherein at least a part of the second semiconductor overlaps with the second pixel electrode, a first end of the second semiconductor is electrically connected to the third pixel electrode through a third connection hole, the third connection hole is located between the second data line and the third data line, the third connection hole and the third sub-pixel are arranged in the first direction, and the third connection hole and the second sub-pixel are arranged in the second direction; the first semiconductor is staggered from the first data line and the second data line.

* * * * *